United States Patent [19]
Isogai

[11] Patent Number: 4,493,059
[45] Date of Patent: Jan. 8, 1985

[54] CIRCUIT AND METHOD FOR WRITING IN A SEMICONDUCTOR MEMORY DEVICE

[75] Inventor: Hideaki Isogai, Higashikurume, Japan

[73] Assignee: Fujitsu Limited, Kawasaki, Japan

[21] Appl. No.: 343,163

[22] Filed: Jan. 27, 1982

[30] Foreign Application Priority Data

Jan. 29, 1981 [JP] Japan ................... 56-11973

[51] Int. Cl.³ .................. G11C 7/00; G11C 11/40
[52] U.S. Cl. .................. 365/190; 365/154; 365/194
[58] Field of Search ................ 365/190, 154, 194

[56] References Cited

U.S. PATENT DOCUMENTS 3,919,566 11/1975 Millhollan et al. ............ 365/190
4,168,539 9/1979 Anderson .................... 365/190
4,272,811 6/1981 Wong ........................ 365/190

OTHER PUBLICATIONS

Beranger et al., "Read and Write Circuits For a Harper Cell Memory", IBM Tech. Disc. Bul., vol. 21, No. 10, 3/79, pp. 4066-4067.

Primary Examiner—James W. Moffitt
Attorney, Agent, or Firm—Staas & Halsey

[57] ABSTRACT

A semiconductor memory device including static memory cells connected at intersections of word lines and pairs of bit lines, in which writing is carried out by changing the potentials of the paired bit lines according to writing data of binary digits "1" and "0" and turning on one transistor of a memory cell while turning off the other transistor of the cell. A characteristic feature of the invention is that, according to the write data, one of the paired bit lines is maintained at a low level while the other bit line is simultaneously maintained at a high level, and the period of maintenance of the high level is shorter than the period of maintenance of the low level.

8 Claims, 11 Drawing Figures

CIRCUIT AND METHOD FOR WRITING IN A SEMICONDUCTOR MEMORY DEVICE

BACKGROUND OF THE INVENTION

The present invention relates to a method and circuit for writing data in a static semiconductor memory device.

In bipolar type static RAM's (random access memory), memory cells are arranged at intersections of word lines and pairs of bit lines in a matrix. Each memory cell is formed of a flip-flop circuit including two transistors, wherein if one transistor is in the on state, the other is in the off state. When a certain word line is selected, the selected word line is maintained at a high level and the information stored in the memory cell is read out via the bit lines. That is, the bit lines are connected to readout transistors, the emitters of which are commonly connected to a constant current source, the bases of which are respectively connected to the bit lines, and the on and off state of the readout transistors is sensed by a sense amplifier.

Writing is carried out by turning on the transistor of the memory cell which is in the off state or by further turning off the transistor of the memory cell which is in the on state.

For the purpose of rapid writing in these bipolar type static RAM's one bit line is placed at a low potential level and the other bit line is placed at a high potential level. When this method is used, writing can be carried out by using write pulses having short pulse widths, whereby the writing operation can be accelerated.

In this method, the waveforms of potentials in various parts of the memory cell are accompanied by vibration, ringing or unwanted oscillation. When potentials applied to the write bit line amplifier are returned to the readout level after the completion of writing, they do not immediately change to the readout level, but first undergo damping vibrations for a while and then settle down. As the readout mode is produced in the memory on completion of writing and as any such vibrations will create a whisker-like peak in the output of the sense amplifier, there is a risk of error caused by such a peak when reading is effected just after writing. Such a whisker-like peak is caused by vibrations generated when one potential at a bit line falls and the other potential at another bit line rises. Especially large vibrations are generated when the potential falls.

SUMMARY OF THE INVENTION

An object of the present invention is to provide a method and circuit for writing in a semiconductor memory device in which the time required for writing can be shortened and adverse characteristics such as the generation of a whisker-like peak are not caused after writing.

In accordance with the present invention, there is provided a method for writing in a semiconductor memory device comprising static memory cells connected at the intersection of a plurality of word lines and pairs of bit lines, in which writing is effected by changing potentials of paired bit lines according to the writing data comprising binary digits "1" and "0" and turning on one transistor of a memory cell while turning off the other transistor of the memory cell. According to said writing data, one of the paired bit lines is maintained at a low level while the other bit line is simultaneously maintained at a high level and the period of maintenance of the high level is shorter than the period of maintenance of the low level.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1A:
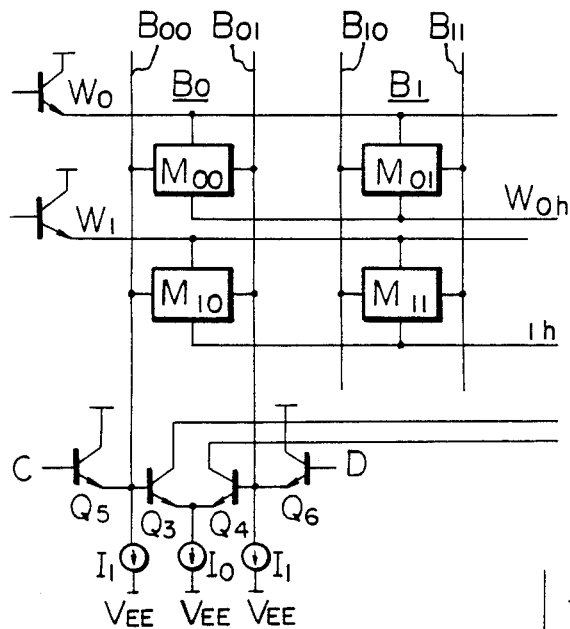
FIGS. 1A, 1B and FIG. 2 are block diagrams of a conventional static memory device.
Figure 1B:
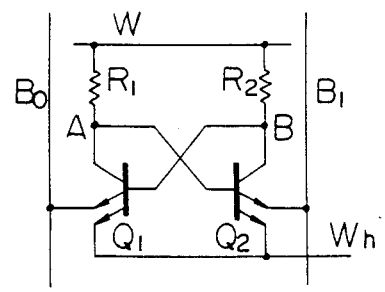

As shown in FIG. 1A, a bipolar type static RAM comprises memory cells $M_{00}$, $M_{01}$, ... arranged in the form of a matrix, each memory cell consisting of a flip-flop, said memory cells being connected to word lines $W_0$, $W_1$, ... and bit lines $B_0$, $B_1$, ... In FIG. 1A, $W_{0h}$ and $W_{1h}$ represent negative side word lines or hold lines, and in $B_{00}$ and $B_{01}$ and other similar symbols attached to the word lines, "0" means a left bit line and "1" means a right bit line in the bit lines used in a pair. Write drive transistors $Q_5$ and $Q_6$ are connected to the left bit line $B_{00}$ and the right bit line $B_{01}$, respectively. The left and right bit lines are connected to transistors $Q_3$ and $Q_4$, respectively. The collectors of the transistors $Q_3$ and $Q_4$ are connected to a sense amplifier and the emitters of these transistors $Q_3$ and $Q_4$ are commonly connected to a constant current source $I_0$. FIG. 1B is a view showing an example of the memory cells $M_{00}$, $M_{01}$ ..., and the example shown in FIG. 2 comprises load resistors $R_1$ and $R_2$ and multiemitter transistors $Q_1$ and $Q_2$.

Since the memory cell is a flip-flop, if one transistor is turned on, the other transistor is turned off. Supposing that the transistor $Q_1$ is in the on state and the transistor $Q_2$ is in the off state, the potential at the point A is maintained at a low (L) level and the potential at the point B is maintained at a high (H) level. When a certain word line is selected, the selected word line is maintained at a high level, for exammple, $V_{CC}$, which changes the potential level at the point B to substantially VCC and the potential at the point A to $V_{CC}$ less the voltage drop of the load resistor. These potentials are transmitted to the bit lines $B_0$ and $B_1$ and one of the readout transistors $Q_3$ and $Q_4$ is turned on. In this example, since the transistor $Q_1$ is turned on and the potential at the point B is at a high level, the bit line $B_0$ is maintained at a high level and the bit line $B_1$ is maintained at a low level. The transistors $Q_3$ and $Q_4$, of the emitters of which are commonly connected to a constant current source $I_0$, form a current switch type differential amplifier, wherein when the transistor $Q_3$ is turned on, the transistor $Q_4$ is turned off. Such an on-off state is detected by a sense amplifier SA (not shown) to produce an output for reading out data stored in the cell.

Figure 2:
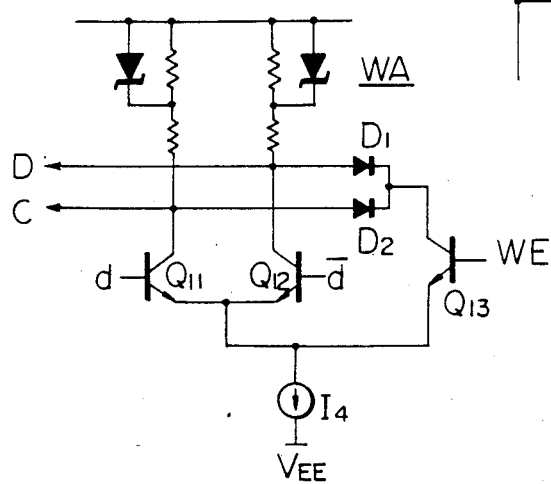

In FIG. 2, $Q_{11}$ through $Q_{13}$ represent transistors, $I_4$ represents a constant current source, $D_1$ and $D_2$ represent diodes, and d and $\bar{d}$ represent signals which are turned to high and low levels according to the writing data "1" and "0". Supposing that the signals d and $\bar{d}$ are turned to high and low levels, in the case of data "1", respectively, the levels of the signals d and $\bar{d}$ are reversed in case of data "0". At the time of reading, the write enable signal WE is maintained at a high level, and, therefore, the transistor $Q_{13}$ is turned on and both the outputs C and D are maintained at the same level (the readout level RL).

Writing is accomplished by turning on the transistor of the memory cell which is in the off state or further turning off the transistor of the memory cell which is in the on state. For example, in the case where the left transistor $Q_1$ is in the on state and the right transistor $Q_2$ is in the off state, if the base potential D of one of the write-in transistors $Q_5$ and $Q_6$ is turned to a low level, of the transistors $Q_2$ and $Q_6$ forming a current switch together with the constant current source $I_1$, the transistor $Q_2$ is turned on, with the result that the transistor $Q_1$ is turned off to effect inversion of the state, that is, writing. At the time of writing, the signal WE is maintained at a low level and the transistor $Q_{13}$ is turned off. Therefore, according to the write-in data, one of the transistors $Q_{11}$ and $Q_{12}$ is turned on while the other transistor is turned off, with the result that one of the outputs C and D is maintained at a high level and the other output is maintained at a low level. At the time of reading, ½ of the current of the constant current source $I_4$ flows through the load resistor, diodes $D_1$ and $D_2$, and transistors $Q_{11}$ and $Q_{12}$ to cause reduction of the voltage in the load resistor. At the time of writing, all of said current flows in the load resistor or said current does not flow in the load resistor at all (change of the current). Accordingly, the readout level RL and the high and low levels H and L at the time of writing are as shown in FIG. 3A.

Figure 3A:
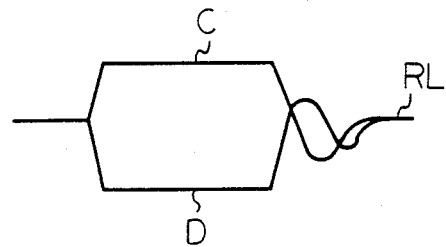
FIGS. 3A, 3B and 3C are diagrams illustrating waveforms generated in the memory device shown in FIG. 1.
Figure 3B:

As shown in FIG. 3A, potential waveforms of the high and low levels H and L are accompanied by vibrations or damped overshoots. That is, as shown in the right portion of FIG. 3A, when potentials C and D are returned to the readout level RL on completion of writing, they are not immediately changed to the level RL, but first undergo damping vibrations for a while and then settle down. As the readout mode is produced in the memory on completion of writing and as any such vibrations will create a whisker-like peak P as shown in FIG. 3B in the output of the sense amplifier, there is a risk of error by such a peak when reading is effected just after writing. Such a whisker-like peak is caused by vibrations generated when the potential C falls and the potential D rises. Especially large vibrations are generated when the potential falls.

Figure 3C:

Writing can also be performed by turning one potential D, that is, the potential of the bit line B, to the low level as shown in FIG. 3C. In the method shown in FIG. 3C, the generation of vibration is relatively controlled, but this method is defective in that the time required for writing is long compared with the method shown in FIG. 3B. That is, reduction of the potential of one bit line and simultaneously elevation of the potential of the other bit line as shown in FIG. 3A, increases the writing speed and enables a smaller writing pulse width PW than in the method shown in FIG. 3C when only the potential of one bit line is reduced.

Figure 4A:
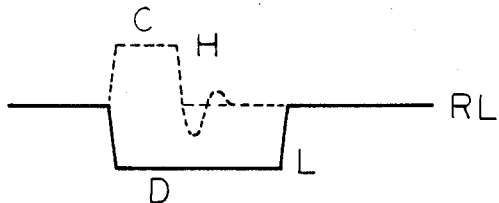
FIGS. 4A, 4B, 4C and 4D are diagrams illustrating waveforms generated in the memory device according to the present invention.

In the present invention, at the time of writing in a memory cell, as shown in FIG. 4A, one of the paired bit lines is maintained at a low level (L) while the other bit line is maintained at a high level (H). This high level is maintained only in the initial stage and is returned to the readout level RL while the low level of the other bit line is still maintained. Adoption of this arrangement allows the vibrations caused by falling to be completed during the writing operation, whereas such vibrations do not effect the bit line level just after completion of the writing operation. Furthermore, since a certain high level period is ensured, turning-off of the transistor which has been in the on state can be performed positively, and, hence, the time required for writing can be shortened. It is sufficient if the period of the high level is several nsec long. Incidentally, the period of the low level, that is, the writing time, is, for example, .0 nsec long, though this time differs to some extent according to the memory. The writing waveform, a part of which is at a high level as shown in the drawings, can be generated easily. One embodiment of this method is illustrated in FIG. 5.

Figure 5:
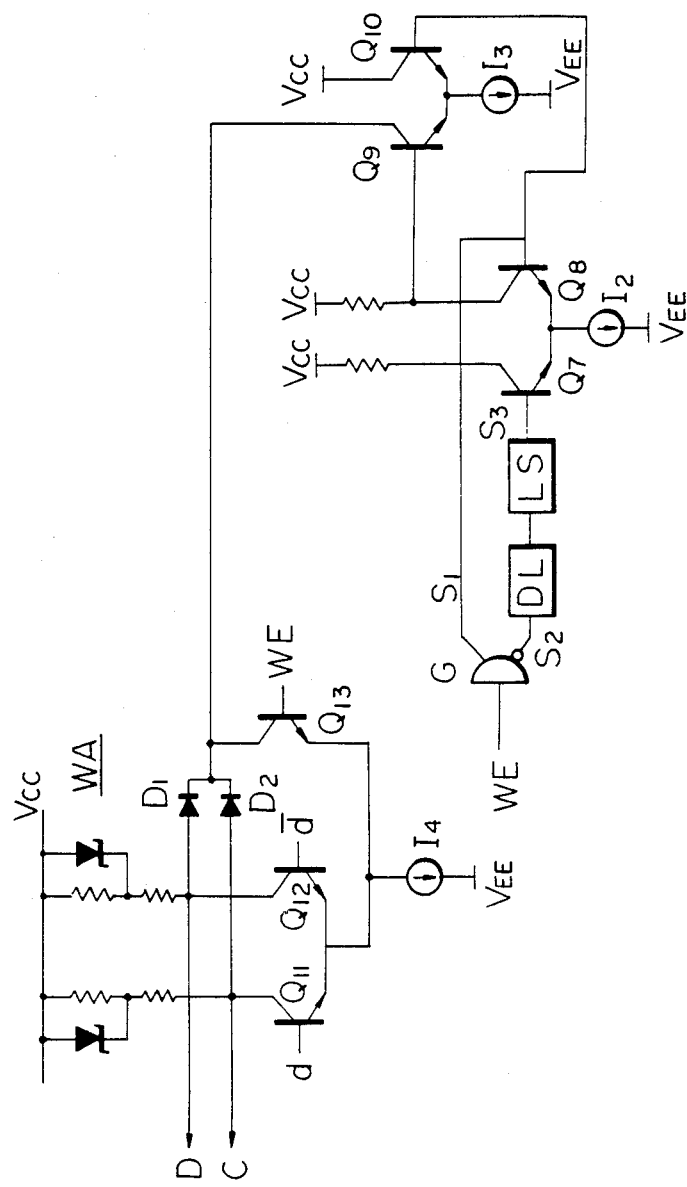
FIG. 5 is a circuit diagram showing one embodiment of the present invention.

FIG. 5 shows a write amplifier WA which generates the signals C and D and a level control circuit attached thereto.

Figure 4B:
Figure 4C:
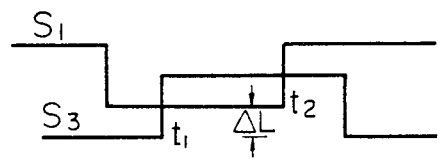
Figure 4D:
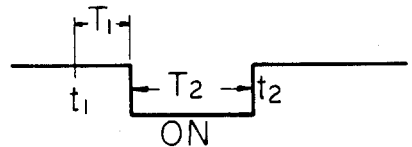

In FIG. 5, G represents a gate circuit for producing signals $S_1$, shown in FIG. 4C and substantially the same as the write enable signal WE, shown in FIG. 4B and an inversion signal $S_2$ thereof; DL represents a delay circuit for delaying the signal $S_2$ by a time $T_1$; LS represents a level shift circuit for producing a signal $S_3$ as shown in FIG. 4C by shifting the level of the delay signal by $\Delta L$; and $Q_7$ and $Q_8$ and $Q_9$ and $Q_{10}$ represent transistors forming current switches together with constant current sources $I_2$ and $I_3$, respectively. $V_{CC}$ is a higher voltage power supply, and $V_{EE}$ is a lower voltage power supply. When the transistors $Q_7$ and $Q_8$ receive such signals $S_1$ and $S_3$, since the level of the signal $S_1$ is higher than the level of the signal $S_3$ before the point $t_1$ and after the point $t_2$ in FIG. 4C, the transistor $Q_8$ is turned on and the transistor $Q_7$ is turned off, but during the period between the points $t_1$ and $t_2$ in FIG. 4C, the on-off state is reversed in the transistors $Q_7$ and $Q_8$. The current switch including the transistors $Q_9$ and $Q_{10}$ receives the output of the current switch including transistors $Q_7$ and $Q_8$ (the collector potential of the transistor $Q_8$) and also receives the signal $S_1$. During the period $T_2$ between the points $t_1$ and $t_2$, the transistor $Q_9$ is turned on and the transistor $Q_{10}$ is turned off. During the period except this period $T_2$, the transistor $Q_{10}$ is turned on and the transistor $Q_9$ is turned off. The output as shown in FIG. 4D of the collector of the transistor $Q_9$ is applied to a write amplifier WA which is the same as that shown in FIG. 2.

If the collector of the transistor $Q_9$ is connected to the collector of the transistor $Q_{13}$, on entrance into the period $T_2$, the higher level output between the outputs D and C is clamped by the transistor $Q_9$ through the diode $D_1$ or $D_2$, and the level is reduced to the readout level RL. This reduction of the level is accomplished, for example, by adjusting the current of the constant current source $I_3$ to ½ of the current of the constant current source $I_4$. Thus, waveforms C and D shown in FIG. 4A are obtained and applied to the bases of the transistors $Q_5$ and $Q_6$ shown in FIG. 1.

As will be apparent from the foregoing description, according to the present invention, there is provided a circuit and writing method in which high-speed writing is possible and good level characteristics can be obtained after writing.

I claim:

1. A method for writing in a semiconductor memory device comprising static memory cells connected at intersections of a plurality of word lines and pairs of bit lines, comprising the steps of:

writing by changing potentials of paired bit lines according to writing data of binary digits "1" and "0" and turning on one transistor of a memory cell while turning off the other transistor of the memory cell; and maintaining one of the paired bit lines at a low level while the other bit line is simultaneously maintained at a high level, where the period of maintenance of the high level is shorter than the period of maintenance of the low level.

2. A circuit for writing in a semiconductor memory device comprising static memory cells connected at intersections of a plurality of word lines and pairs of bit lines, in which writing is effected by changing potentials of paired bit lines according to writing data of binary digits "1" and "0" and turning on one transistor of the one of the memory cells while turning off the other transistor of one of said memory cells, emitters of said transistors of said memory cell being connected to the bit lines respectively, said circuit comprising:

a pair of write-in transistors having emitters connected to the bit lines, respectively and having bases; and a write amplifier having outputs connected to the respective bases of said write-in transistors, wherein according to said writing data, one of the outputs is maintained at a low level while the other output is simultaneously maintained at a high level and the period of maintenance of the high level is shorter than the period of maintenance of the low level.

3. A circuit for writing in a semiconductor memory device according to claim 2, wherein said circuit is operatively connectable to receive a write enable signal, and wherein said write amplifier comprises:

first and second transistors, said first and second transistors having collectors connected to said outputs, having bases which receive the write data "0" and "1", and having emitters commonly connected;

two diodes connected to said collectors of said first and second transistors and to each other, a connection point being formed between said diodes;

a third transistor having a collector connected to the connection point between said diodes, having a base which receives the write enable signal and having an emitter; and a first constant current source having one terminal connected to the commonly connected emitters of said first and second transistors and to the emitter of said third transistor, and having the other terminal connected to a power supply, wherein when the data are readout, said write enable signal has a high voltage level so that said collectors of said first and second transistors are placed at the same level, wherein said write amplifier is operatively connectable to receive a clamping signal, and wherein when the data are written in, said write enable signal has a low voltage level and the clamping signal, which clamps one of the collectors of said first and second transistors during a period between a time which is delayed by a predetermined time from the fall time of said write enable signal and a time corresponding to the rise time of said write enable signal, is applied to the connection point between said diodes and the collector of said third transistor.

4. A circuit for writing in a semiconductor memory device according to claim 3, further comprising a circuit for generating said clamping signal comprising:

a second constant current source;

a gate circuit which receives said write enable signal and which generates a first signal the same polarity as said write enable signal and a second signal having an opposite polarity with respect to said first signal;

a delay circuit, connected to said gate circuit, for delaying said second signal and for producing a third signal;

a level shift circuit which is connected to said delay circuit and which shifts the voltage level of said third signal to produce a fourth signal;

a fourth transistor, operatively connected to said level shift circuit, having an emitter and having a base which receives said fourth signal;

a fifth transistor, operatively connected to said fourth transistor and said gate circuit, having a collector, having a base which receives said first signal and having an emitter which is commonly connected together with the emitter of said fourth transistor to said second constant current source;

a sixth transistor, operatively connected to said fifth transistor, having an emitter, having a collector and having a base which receives the collector output of said fifth transistor; and a seventh transistor having a base which is connected to the base of said fifth transistor and having an emitter which is commonly connected together with the emitter of said sixth transistor, the collector of said sixth transistor being connected to the connection point between said two diodes.

5. A memory device operatively connectable to receive a write enable signal, and comprising:

memory cell means for producing sense amplifier signals when said memory cell means is accessed;

write amplifier means, operatively connected to said memory cell means, for controlling memory cell means write signals; and level control means, operatively connected to said write amplifier means, for controlling the write levels of the write signals, and level control means comprising:

a gate circuit operatively connectable to receive the write enable signal;

a delay circuit operatively connected to said gate circuit;

a level shift circuit operatively connected to said delay circuit;

a first current switch operatively connected to said gate circuit and said level shift circuit; and a second current switch operatively connected to said first current switch, said gate circuit and said write amplifier means.

6. A memory device according to claim 5, wherein said write levels comprise first and second levels and said second level is maintained longer than said first level.

7. A memory device according to claim 6, wherein said write ampllifier means comprises:

first and second diodes operatively connected to said memory cell means and said second current switch;

first and second transistors operatively connected to said first and second diodes, respectively;

a third transistor operatively connected to said first and second diodes, said second current switch and said first and second transistors and operatively connectable to receive the write enable signal; and a constant current source operatively connected to said first through third transistors.

8. A memory device according to claim 7, wherein said memory cell means comprises:

a drive circuit operatively connected to said first and second diodes and said first and second transistors;

a memory cell current switch operatively connected to said drive circuit; and a memory cell array operatively connected to said drive circuit and said memory cell current switch.

* * * * *